(12) United States Patent
Wicker

(10) Patent No.: US 7,382,293 B1
(45) Date of Patent: Jun. 3, 2008

(54) DATA DECOMPRESSION

(75) Inventor: David J. Wicker, Hillsboro, OR (US)

(73) Assignee: Lattice Semiconductor Corporation, Hillsboro, OR (US)

(*) Notice: Subject to any disclaimer, the term of this patent is extended or adjusted under 35 U.S.C. 154(b) by 449 days.

(21) Appl. No.: 11/054,750

(22) Filed: Feb. 10, 2005

(51) Int. Cl.
H03M 7/03 (2006.01)

(52) U.S. Cl. .......................... 341/67; 326/38

(58) Field of Classification Search ............... 341/50, 341/51, 63, 67, 107; 377/64–81; 326/38
See application file for complete search history.

(56) References Cited

U.S. PATENT DOCUMENTS

| | | | |
|---|---|---|---|
| 3,717,851 A * | 2/1973 | Cocke et al. ............... | 341/106 |
| 4,377,757 A * | 3/1983 | Konemann et al. ......... | 326/16 |
| 5,008,905 A * | 4/1991 | Lee et al. .................... | 377/77 |
| 5,220,325 A * | 6/1993 | Ackland et al. ............. | 341/67 |
| 5,394,031 A * | 2/1995 | Britton et al. .............. | 326/38 |
| 5,563,592 A | 10/1996 | Cliff et al. | |
| 5,745,734 A | 4/1998 | Craft et al. | |
| 5,768,372 A | 6/1998 | Sung et al. | |
| 5,872,529 A | 2/1999 | Mejia | |
| 6,028,445 A | 2/2000 | Lawman | |
| 6,327,634 B1 | 12/2001 | Statovici | |
| 6,493,862 B1 | 12/2002 | Young | |
| 6,507,943 B1 | 1/2003 | Kelem | |
| 6,525,678 B1 | 2/2003 | Veenstra | |
| 6,563,437 B1 | 5/2003 | Landry et al. | |
| 6,714,044 B1 * | 3/2004 | Rangan et al. ............. | 326/40 |
| 6,744,388 B1 | 6/2004 | Khu | |

* cited by examiner

*Primary Examiner*—Howard L. Williams
(74) *Attorney, Agent, or Firm*—MacPherson Kwok Chen & Heid LLP; Jonathan W. Hallman

(57) ABSTRACT

In one embodiment, a decompression circuit is provided for a data stream that includes code words representing compressed data and uncompressed data. The decompression circuit includes a translation circuit adapted to identify the code words in the data stream and to translate the identified code words into corresponding decompressed data words; and a shift register operable to serially shift in uncompressed data in the data stream and to shift in parallel the decompressed data words from the translation circuit.

18 Claims, 6 Drawing Sheets

US 7,382,293 B1

DATA DECOMPRESSION

TECHNICAL FIELD

The present invention relates generally to data decompression, and more particularly to the decompression of both serial and parallel data.

BACKGROUND

Many types of electronic devices require that information be loaded from a source and stored in a memory. For example, programmable logic devices are configured to implement a desired logical function based upon configuration data provided by a programming tool. The configuration data may be stored internally for a non-volatile device or externally for a volatile device. Regardless of whether the configuration data is stored internally or externally, the increasing complexity of programmable logic devices requires larger and larger amounts of configuration data. This increased configuration data size produces delays in the configuration process and increases the costs.

During the configuration process, the configuration data is typically serially-shifted into the devices responsive to cycles of a clock signal. For example, it is common to have one bit of the configuration data shift in for each clock cycle. As seen in FIG. 1, the configuration data is shifted into a shift register 100 as serial data 110. When the shift register has been filled, the contents are transferred in parallel to a memory 120. For example, should shift register 100 be thirty-two bits long, thirty-two bits of serial data 110 would be shifted into shift register 100 responsive to thirty-two cycles of clock signal 125. The resulting thirty-two bit word stored within shift register 100 is then transferred into memory 120, whereupon another thirty-two bits of data may shift into shift register 100, and so on.

To reduce the storage requirement for the configuration data, the configuration data may be compressed. In addition, the compression of the configuration data decreases the amount of time needed to configure the corresponding programmable logic devices. Because a programmable logic device is very sensitive to errors in the configuration data stream, any compression of the data must be lossless or perfect such that the decompressed configuration data is exactly the same as the configuration data before compression. Because of the requirement for perfect compression, only a portion of the configuration data can generally be compressed. Thus, the configuration data being shifted into the device will comprise both uncompressed and compressed data. This mixed nature of the configuration data complicates the configuration data flow described with respect to FIG. 1. Any compressed configuration data must be decompressed before configuration may be completed. But recall that the configuration data is being shifted at a constant rate responsive to cycles of the clock signal. When data is decompressed, this constant rate must necessarily change. This adds complexity to the configuration process because it must accommodate the rate changes depending upon whether configuration data being shifted in was compressed or not. This accommodation may take place in the programming tool providing the bit stream or may take place within the device. Regardless of where the accommodation takes place, it adds considerable complexity to the configuration circuitry and the software controlling the configuration process. Moreover, this complexity inherently limits the bit rate of the configuration data stream. As a result of this complexity, comparatively few programmable devices utilize configuration data compression, particularly in low-cost devices.

Accordingly, there is a need in the art for improved decompression techniques for data streams.

SUMMARY

One aspect of the invention relates to a data decompression circuit for a data stream including code words representing compressed data words, the data stream also including uncompressed data, comprising: a translation circuit adapted to identify the code words in the data stream and to translate the identified code words into corresponding decompressed data words; and a shift register operable to serially shift in uncompressed data from the data stream and to shift in parallel the decompressed data words from the translation circuit.

Another aspect of the invention relates to a method of decompressing a serial data stream including code words representing compressed data, the data stream also including uncompressed data, the method comprising: examining the data stream to identify code words therein; if a code word representing compressed data is identified, translating the code word into a decompressed data word; and shifting the decompressed data word in parallel into a shift register.

Another aspect of the invention relates to a data decompression circuit for a data stream including code words representing compressed data and uncompressed data, comprising: a translation circuit operable to receive the data stream and distinguish between code words representing compressed data and uncompressed data therein, the translation circuit further operable to translate code words representing compressed data into decompressed data words; a shift register operable to serially shift in uncompressed data from the data stream in response to a first signal from the translation circuit and to shift in parallel decompressed data words in response to a second signal from the translation circuit.

BRIEF DESCRIPTION OF THE DRAWINGS

Use of the same reference symbols in different figures indicates similar or identical items.

DETAILED DESCRIPTION

Figure 2:
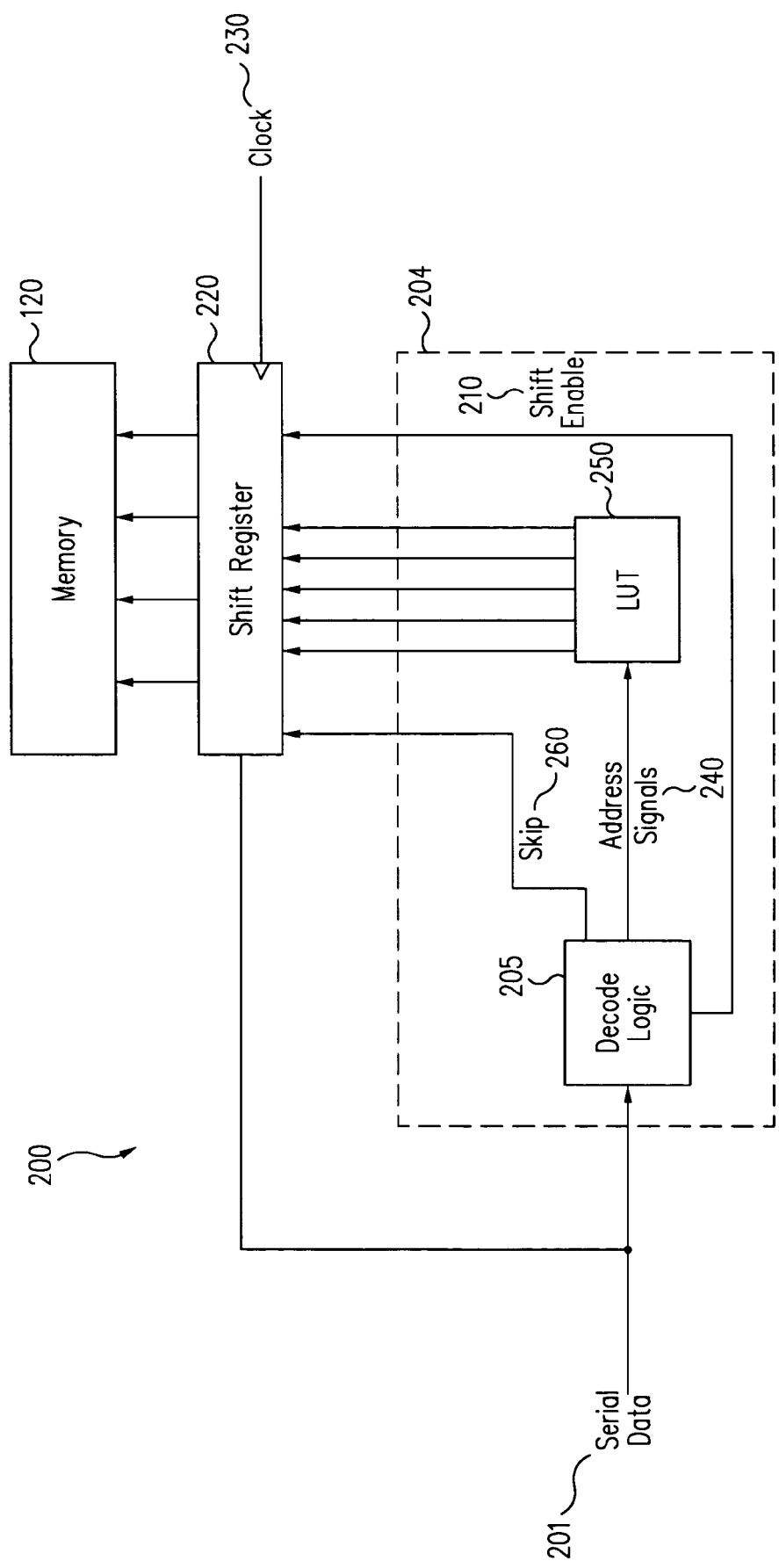
FIG. 2 is a block diagram of a system for the decompression of a serial data stream according to an embodiment of the invention.

An exemplary embodiment of a data decompression circuit 200 is illustrated in FIG. 2. Serial data 201 has been compressed with a lossless compression scheme that searches for specific patterns and substitutes shorter words, which may be denoted as code words, for the specific patterns. For example, if a serial data stream includes, in hexadecimal format, the eight-bit data word [0a], a compression encoder may identify this data word and substitute it with the two-bit binary code word 01. In such a scheme, because the code words are just two bits, only four different words could be compressed. As the length of the code words increases, additional different words could be compressed. Because the compression must be perfect for devices such as programmable logic devices, some data will typically not be compressed in a lossless compression scheme. A code word may be reserved for this uncompressed data. For example, in a two-bit code word scheme, the code word 00 may be used to identify data that is not compressed. Thus, all data in serial data stream 201 may be associated with a code word (which may also be considered as "header" metadata) regardless of whether it is compressed or uncompressed. If a data word is compressed, it is represented by the code word. If a data word is uncompressed, it will follow the appropriate code word identifying this uncompressed data word. A code word-to-data word translation circuit 204 receives the serial data stream 201 and identifies code words corresponding to compressed data words and translates the identified code words into the corresponding decompressed data words.

It will be appreciated that translation circuit 204 may be constructed using many alternative embodiments. For example, translation circuit 204 may comprise a decode logic circuit 205 that identifies the code words corresponding to compressed data words and translates the identified code words into address signals 240 provided to a lookup table 250. Lookup table 250 includes a memory such as a ROM or a RAM that stores the decompressed data words. In response to receiving the address signals 240, lookup table 250 "looks up" the corresponding stored decompressed data word at the identified address. Alternatively, translation circuit 204 may comprise a state machine (not illustrated) constructed such that it algorithmically generates the decompressed data words from the corresponding code words. In this fashion, translation circuit 204 need not store the decompressed data words in a memory but could simply generate them in response to receiving the corresponding code words.

Figure 1:
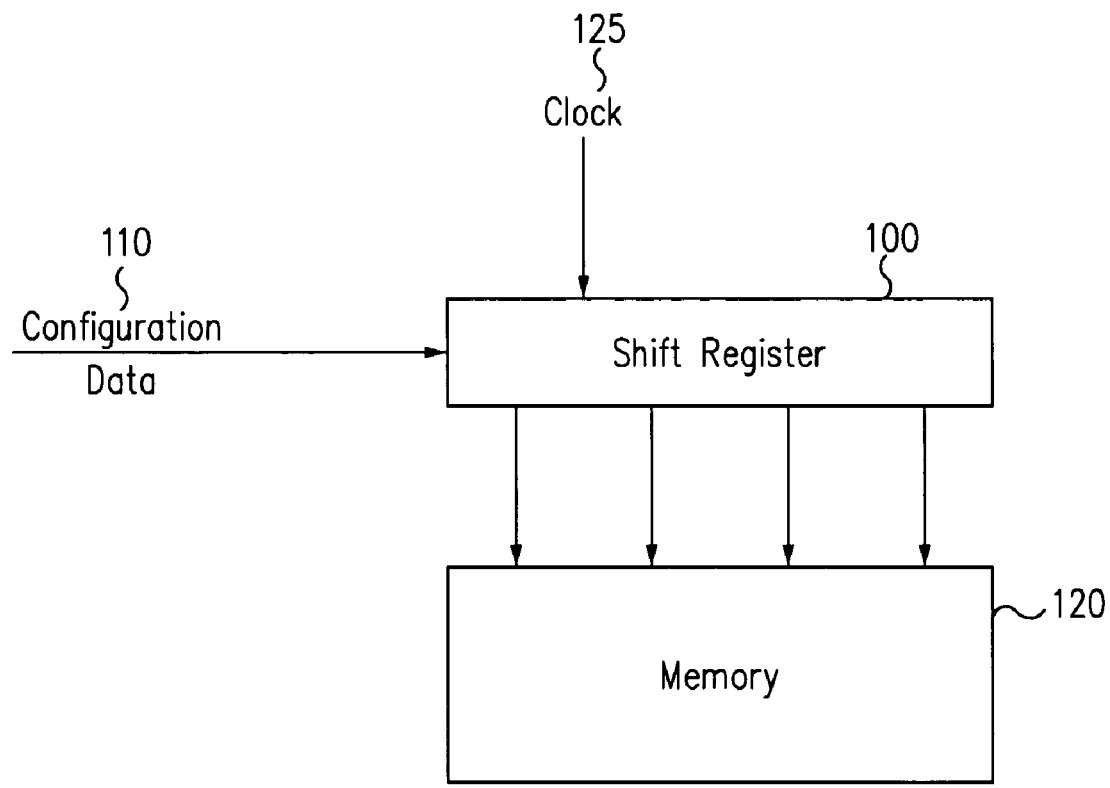
FIG. 1 is a block diagram illustrating the operation of a conventional configuration shift register.

A shift register 220 also receives the serial data stream 201. However, because of the presence of code words in the serial data stream 201, the serial data stream 201 cannot simply be blindly shifted into shift register 220 as discussed with respect to FIG. 1. Whether data may be shifted into shift register 220 is controlled by decode logic 205 through the generation of a shift enable signal 210. When shift enable signal 210 is asserted, uncompressed data words in serial data stream 201 may be shifted into shift register 220 at a bit at a time responsive to cycling of a clock signal 230. For example, should the decode logic 205 identify a code word such as 00 that indicates the associated data is uncompressed, decode logic 205 asserts shift enable signal 210. The corresponding uncompressed data word in serial data stream 201 may then be serially shifted into shift register 220. However, should decode logic 205 identify a code word representing compressed data, it generates address signals 240 that are received by lookup table 250. Lookup table 250 responds to address signals 240 by looking up and retrieving the corresponding decompressed data word. The retrieved decompressed data word may then be coupled in parallel to shift register 220. To signal that shift register 220 is to receive a word in parallel rather than a serial bit shift as would occur for uncompressed data, decode logic 205 may assert a skip signal 260 in addition to asserting the shift enable signal 210 in conjunction with the provision of the address signals to the lookup table.

Because shift register 220 may receive both uncompressed data in a serial fashion as well as decompressed data words from lookup table 250 in parallel, shift register 220 should accommodate both types of data reception. Uncompressed data may be serially shifted in a bit at a time in a conventional fashion as discussed with respect to FIG. 1. However, if a decompressed data word from lookup table 250 is loaded into shift register 220 in parallel, the contents of shift register 220 should shift responsive to the length of the decompressed data word. For example, suppose shift register 220 is thirty-two bits long. If the decompressed code words provided by lookup table 250 are eight bits in length, the contents of shift register 220 should shift an eight-bit word at a time when the decompressed code word is shifted into shift register 220. To accommodate this word shifting, shift register 220 may be constructed as a series of shift register cells.

Figure 3:
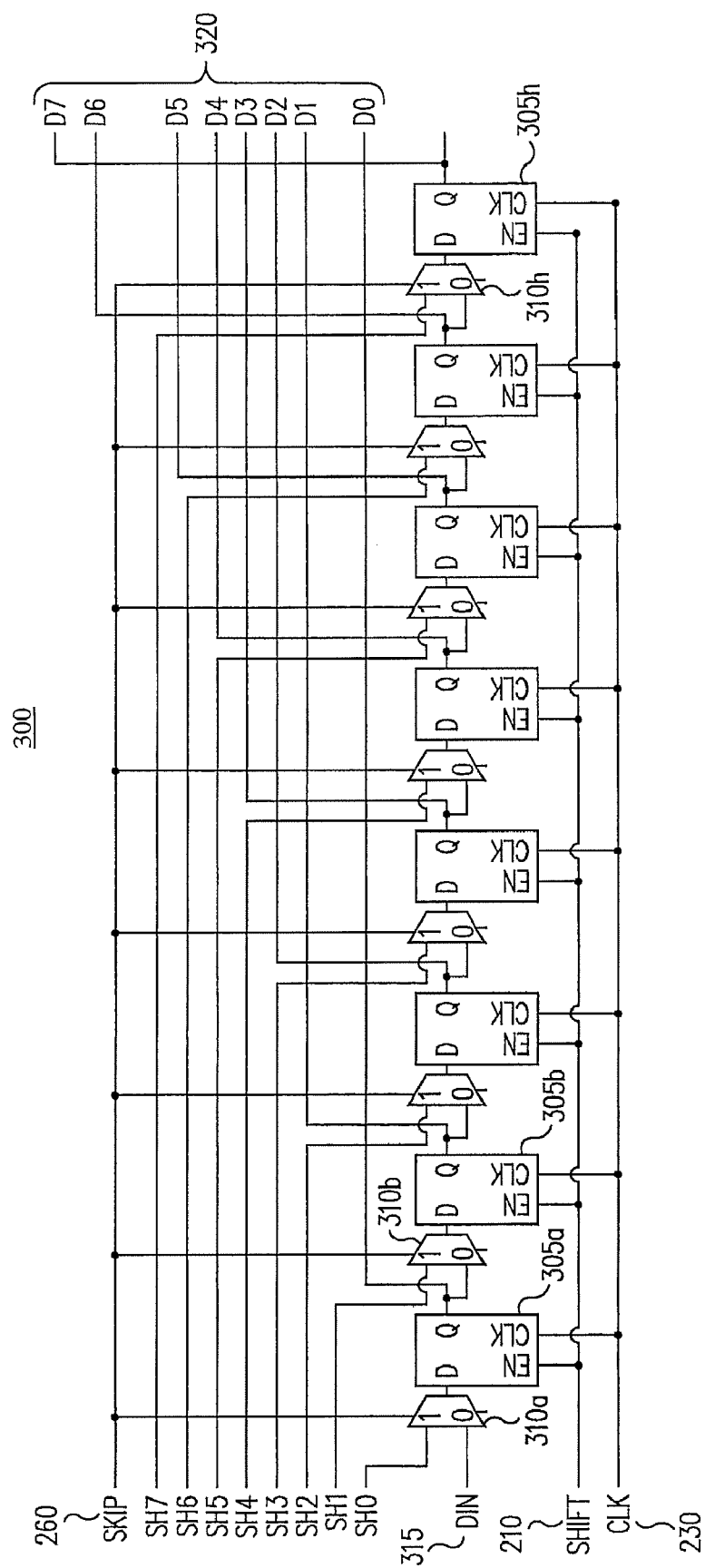
FIG. 3 is a schematic illustration of a shift register cell according to an embodiment of the invention.

An exemplary shift register cell 300 is illustrated in FIG. 3 for the reception of an 8-bit decompressed data word from LUT 250 of FIG. 2. The 8-bit decompressed data word is received as signals SH0 through SH7. Shift register cell 300 includes eight registers 305. A first register 305a may receive signal SH0 through a multiplexer 310a. Similarly, a second register 305b may receive signal SHI through a multiplexer 305b. This pattern is repeated for the remaining registers 305 such that a final register 305h may receive signal SH7 through a multiplexer 310h. Each multiplexer 310 is controlled by skip signal 260 to select its corresponding bit (one of SH0 through SH7) of the decompressed data word. Thus, when the skip signal is asserted the bits SH0 through SH7 will couple through multiplexers 320 to a D input for the registers 305. When shift enable signal 210 and clock 230 are asserted, the bits SH0 through SH7 will be registered within the corresponding registers 305. Upon registration, a Q signal for each register 305 will equal the corresponding bit signals SH0 through SH7.

To enable a conventional serial shifting of uncompressed data, multiplexer 310a also receives a DIN signal 315 representing the serial data stream 201 of FIG. 2. Should skip signal 260 not be asserted during the assertion of shift enable signal 210, DIN signal 315 will successively shift through shift register cell 300 as the Q signal for each register 305 as clock 230 cycles. For example, DIN signal 315 will be registered as the Q signal of register 305a upon the first cycle of clock 230. At the next cycle of clock 230, DIN signal 315 will be registered as the Q signal of register 305b, and so on. In this fashion, shift register cell 300 functions as a conventional shift register when shift signal 210 is asserted and skip signal 260 is not asserted. However, when skip signal 260 is asserted, a decompressed data word is loaded in parallel into shift register cell 300. It will be appreciated that shift register cell 300 need not be responsive to cycles of clock 230 but instead could be triggered by edge transitions in clock 230. For example, if shift register cell 300 is responsive to both rising and falling clock edges, the shift speed through shift register cell 300 is doubled compared to an embodiment responsive only to cycles of clock 230.

Figure 4:
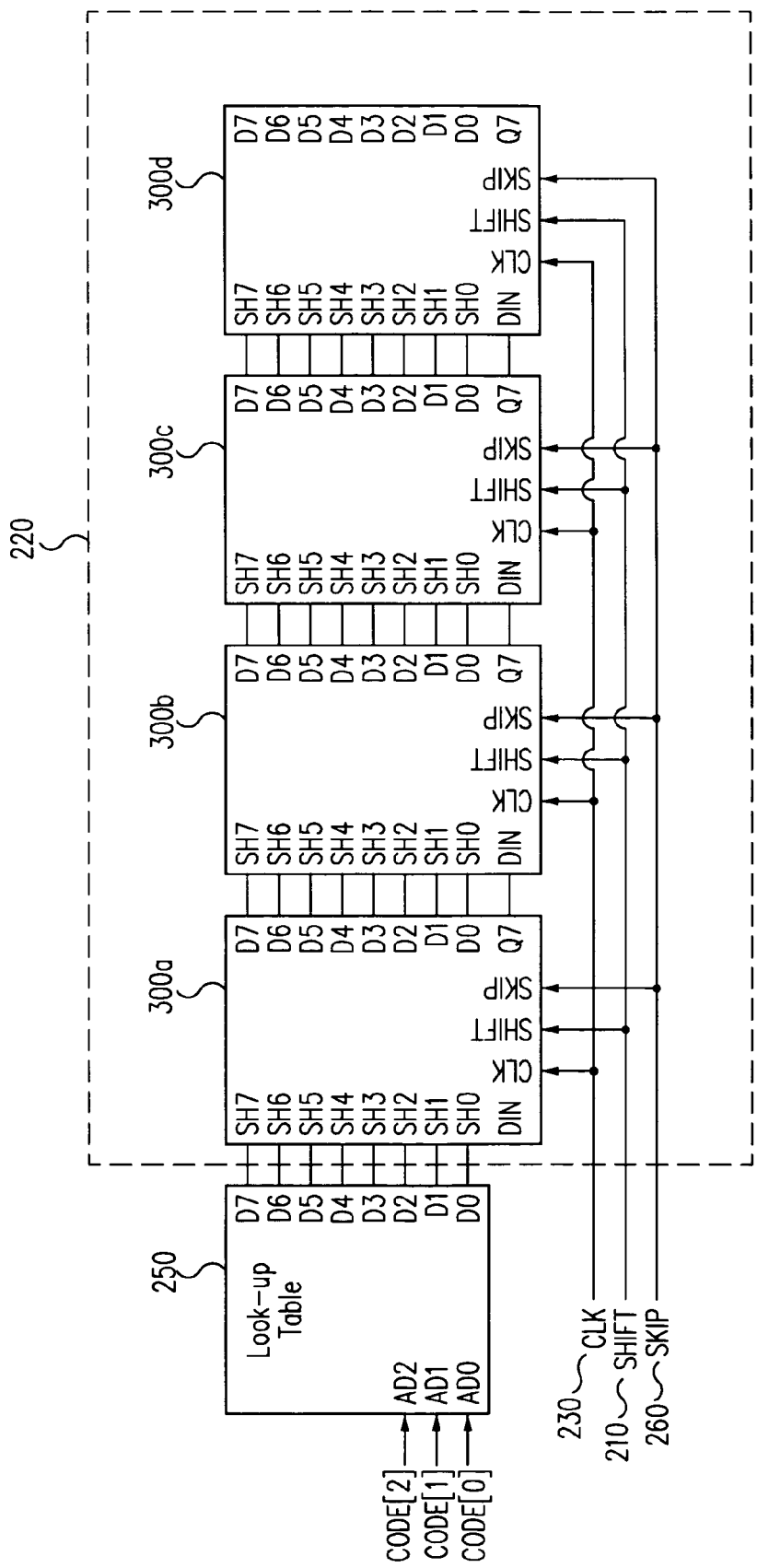
FIG. 4 illustrates the relationship between the shift register cells and the lookup table in accordance with an embodiment of the invention.

When a decompressed data word is loaded in parallel into shift register cell 300, the previous data word stored in shift register cell 300 should be shifted in parallel to another shift register cell so that this previously-stored data word is not lost. Turning now to FIG. 4, an arrangement of shift register cells 300a through 300d is shown that allows such a shift. As seen in FIG. 3, the Q signal from each register 305 couples to a bus 320 as signals D0 through D7. For example, the Q signal from register 305*a* couples to bus 320 as signal D0 whereas the Q signal from register 305*b* couples to bus 320 as signal D1, and so on. Shift register cell 300*b* receives its bit signals SH0 through SH7 as signals D0 through D7, respectively. Thus, when skip signal 260 and shift enable signal 210 are asserted and clock signal 230 cycles, an eight bit word stored as signals D0 through D7 in shift register cell 300*a* transfers in parallel to the corresponding registers 305 in shift register cell 300*b*. For example, signal D0 from shift register cell 300*a* becomes registered as the Q signal in register 305*a* of shift register cell 300*b*. Similarly, signal D1 from shift register cell 300*b* becomes registered as the Q signal in register 305*b* of shift register cell 300*b*, and so on.

To enable serial shifting of uncompressed data, the Q7 signal from register 305*h* in shift register cell 300*a* couples as signal DIN to multiplexer 310*a* of shift register cell 300*b*. Similarly, the Q7 signal from register 305*h* in shift register cell 300*b* couples as signal D1 to multiplexer 310*a* of shift register cell 300*c*, and so on. Regardless of whether serial or parallel shifting is enabled according to the state of skip signal 260, data is continually shifted through shift register 220 until it is full of fresh data. When shift register 220 is filled with fresh data, the entire data contents stored in shift register 220 may be transferred in parallel to memory 120 as discussed with respect to FIG. 1. For example, with respect to the embodiment of shift register 220 illustrated in FIG. 4, thirty-two bits of new data should be shifted in before shift register 220 transfers its stored data to memory 120. This transfer may also be conducted serially at the cost of greater transmission time and complexity. Typically, when shift register 220 has been completely filled with new data, the contents may be transmitted in parallel as one word to memory 120.

Operation of system 200 may be explained with respect to the following data represented in hexadecimal format as: [0a][2c][45][2c][e3][c4][0a][0a] A compression scheme searches for repetitive patterns in the data and replaces them with code words. An exemplary compression scheme for the data stream just described is:

Code 01=0a

Code 10=2c

Code 11=45

Code 00=no compression.

Applying this compression to the data stream just described produces serial data stream 201 as:

01 10 11 10 00[e3] 00[c4] 01 01 with the leftmost 01 being the beginning of the above data stream.

Decode logic 205 responds to the presence of code word 01 by providing address signals 240 to LUT 250 such that the word [0a] is loaded in parallel into the first shift register cell 300*a*. The analogous process occurs for the code word sequences 10, 11, and 10. However, when code word [00] is identified by decode logic 205, the eight bits representing [e3] in serial data stream 200 are serially shifted into shift register 220. The analogous process occurs for the processing of 00[c4]. Finally, the code words 01 are identified by decode logic 205 and the decompressed data words [0a] loaded in parallel into shift register cell 300*a*. The resulting signal flow is:

| Serial data stream 201: | 01101110001110001100110001000101 |
| Shift skip 260: | 01010101001111111100111111110101 |
| Shift enable 210: | 01010101000000000000000000000101 |
| Code [1]: | x0x1x1x1xxxxxxxxxxxxxxxxxxxxx0x0 |
| Code [0]: | x1x0x1x0xxxxxxxxxxxxxxxxxxxxx1x1 |

It will be appreciated that the compression scheme just described uses two-bit code words merely for exemplary purposes. A more practical compression scheme would use more bits in the code words so that more data words could be compressed. For example, the use of 8-bit code words would allow the compression of 256 data words. Moreover, the code words may have varying lengths.

Figure 5:
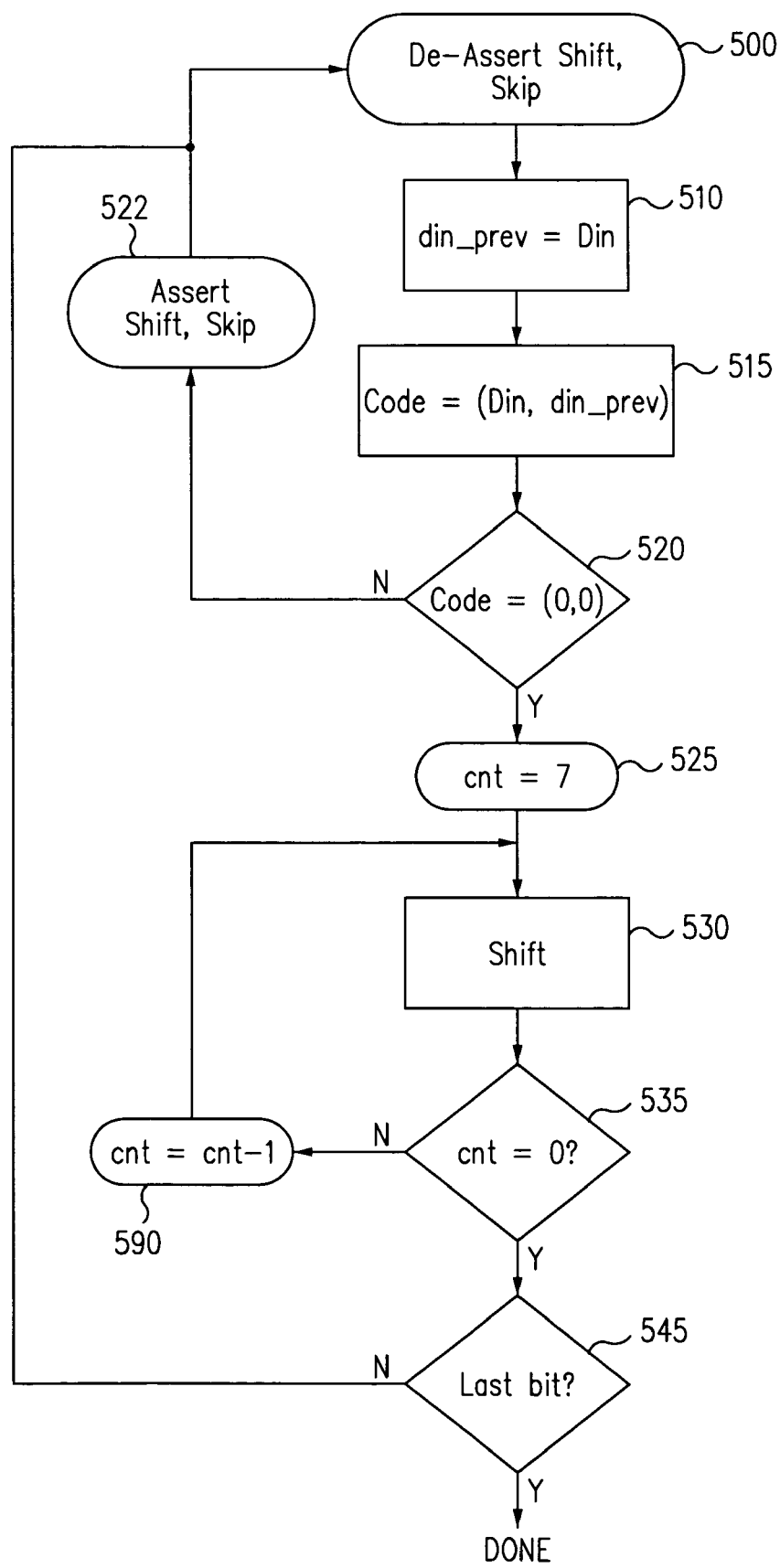
FIG. 5 is a flowchart illustrating the logic performed by the decode circuit of FIG. 2 in accordance with an embodiment of the invention.

A flowchart for the logic implemented by decode logic 205 is illustrated in FIG. 5. At an initial step 500, variables shift enable 210 and shift skip 260 are de-asserted. At step 510, a variable din_prev is set to the current input bit, denoted as Din, in the serial data stream 201. The code may then be formed for the next incoming data bit Din in the serial data stream 201 as {Din, din_prev} in step 515. Whether the code indicates no compression is determined in step 520. If there is compression, shift 210 and skip 260 are asserted in step 522 so that the decompressed data word from LUT 250 may be loaded into shift register 220. If there is no compression, a variable count (cnt) is set to seven in step 525. After asserting shift 210 in step 530 so that the current input bit Din may be shifted into shift register 220, the variable count is compared to zero in step 535. If this variable is not equal to zero, it is decremented in step 590 and the data shifting cycle in step 530 repeated. If count has been decremented to zero, the presence of additional bits in the serial data stream 201 is examined in step 545. If there are remaining bits, the process begins anew at step 500. It will be appreciated that the logic flow described with respect to FIG. 5 is merely exemplary and may be readily modified for other compression schemes.

Note the advantages of the data decompression scheme described herein. Code words are continually processed by decode logic 205. Should a processed code word indicate that the associated data is uncompressed, this uncompressed data may be serially shifted into shift register 220 a bit at a time responsive to clock 230. Should a processed code word indicate that the associated data is compressed, the corresponding decompressed data word is provided by LUT 250 to shift register 220 in parallel responsive to clock 230. Thus, as clock 230 cycles, either a bit of uncompressed data serially shifts into shift register 220 or a decompressed data word shifts in parallel into shift register 220. The incoming data rate in shift register 220 is thus kept synchronous with both the compressed and uncompressed data. The data rate change between uncompressed data and decompressed data words is accommodated very efficiently and simply.

Figure 6:
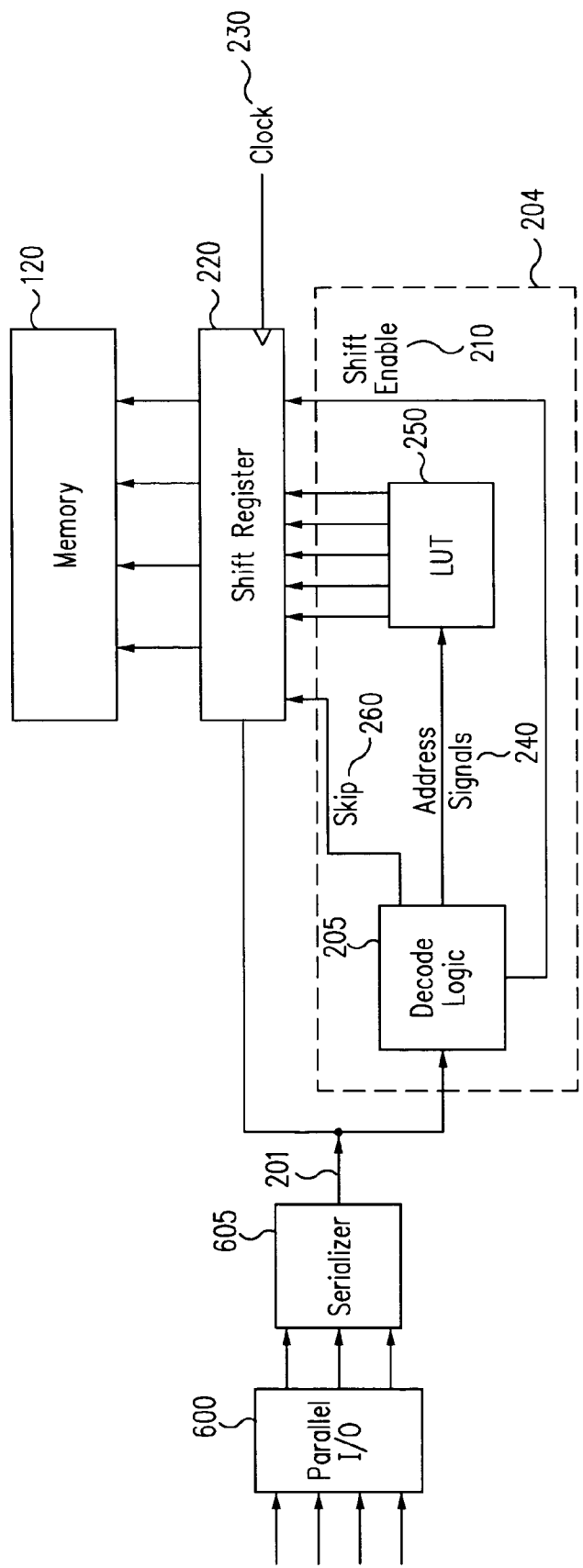
FIG. 6 is a block diagram of a system for serializing a parallel data stream into a serial data stream that is then decompressed according to an embodiment of the invention.

The above-described embodiments of the present invention are merely meant to be illustrative and not limiting. It will thus be obvious to those skilled in the art that various changes and modifications may be made without departing from this invention in its broader aspects. For example, the external data stream being decompressed need not be serial. Turning now to FIG. 6, a parallel interface 600 may be used to receive data from an external source in parallel. A serializer 605 serializes parallel data from interface 600 to provide serial data stream 201, which is then processed as discussed with respect to FIG. 2. Accordingly, the appended claims encompass all such changes and modifications as fall within the true spirit and scope of this invention.

I claim:

1. A data decompression circuit for a data stream including code words representing compressed data words, the data stream also including uncompressed data, comprising:
   a translation circuit adapted to identify the code words in the data stream and to translate the identified code words into corresponding decompressed data words; and
   a shift register operable to serially shift in uncompressed data from the data stream and to shift in parallel the decompressed data words from the translation circuit, wherein the shift register comprises a plurality of shift register cells, and wherein a first one of the shift register cells is adapted to shift its contents serially or in parallel to a second one of the shift register cells.

2. The data decompression circuit of claim 1, wherein the data stream includes at least one code word representing uncompressed data, and the translation circuit is adapted to distinguish between a code word representing uncompressed data and a code word representing a compressed data word.

3. The data decompression circuit of claim 1, wherein the translation circuit comprises:
   decode logic operable to identify code words in the data stream and to provide address signals; and
   a lookup table operable to receive the address signals and to retrieve decompressed data words corresponding to the code words identified by the decode logic.

4. The data decompression circuit of claim 1, wherein the translation circuit comprises a state machine adapted to identify code words in the data stream and to algorithmically generate corresponding decompressed data words from identified code words.

5. The data decompression circuit of claim 1, wherein each shift register cell comprises a plurality of registers arranged in series, each register coupling to a multiplexer that may select for a bit of the uncompressed data or a bit of the decompressed data words.

6. The data decompression circuit of claim 1, wherein the translation circuit generates a control variable received by the shift register, the control variable controlling whether the shift register serially shifts in uncompressed data from the data stream or shifts in parallel a decompressed data word.

7. The data decompression circuit of claim 1, wherein the data stream is a parallel data stream, the circuit further comprising:
   a parallel data input interface operable to receive a parallel data stream; and
   a serializer operable to receive parallel data from the parallel data interface and to provide a serial data stream including the code words and the uncompressed data.

8. The data decompression circuit of claim 1, wherein the data decompression circuit is integrated within a programmable logic device.

9. The programmable logic device of claim 8, wherein the programmable logic device includes a configuration memory, and wherein the shift register is operable to provide the uncompressed data and the decompressed data words to the configuration memory.

10. A method of decompressing a serial data stream including code words representing compressed data, the data stream also including uncompressed data, the method comprising:
    examining the data stream to identify code words therein;
    if a code word representing compressed data is identified, translating the code word into a decompressed data word; and
    shifting the decompressed data word in parallel into a shift register, wherein the shift register comprises a plurality of shift register cells, each shift register cell having a data width matching a data width of the decompressed data words, the shift register cells being arranged from a first shift register cell to a last shift register cell, and wherein shifting the decompressed data word in parallel into the shift register comprises shifting the decompressed data word in parallel into the first one of the shift register cells while shifting the contents of the first one of the shift register cells in parallel to a second one of the shift register cells, and so on, until the contents of a next-to-last shift register cell is shifted in parallel to a last one of the shift register cells.

11. The method of claim 10 wherein the data stream includes at least one code word representing uncompressed data, the method further comprising:
    if a code word representing uncompressed data is identified, shifting the uncompressed data serially into the shift register.

12. The method of claim 11, further comprising:
    writing the contents of the shift register into a memory.

13. The method of claim 12, wherein the memory is a configuration memory of a programmable logic device.

14. The method of claim 10, wherein each shift register cell comprises a plurality of registers arranged from a first register to a last register, and wherein shifting the uncompressed data serially into the shift register comprises shifting the uncompressed data serially into the first register in the first shift register cell.

15. A data decompression circuit for a data stream including code words representing compressed data and uncompressed data, comprising:
    a translation circuit operable to receive the data stream and distinguish between code words representing compressed data and uncompressed data therein, the translation circuit further operable to translate code words representing compressed data into decompressed data words;
    a shift register operable to serially shift in uncompressed data from the data stream in response to a first signal from the translation circuit and to shift in parallel decompressed data words in response to a second signal from the translation circuit, wherein the shift register comprises a plurality of shift register cells, and wherein a first one of the shift register cells is adapted to shift its contents serially or in parallel to a second one of the shift register cells.

16. The data decompression circuit of claim 15, wherein the data decompression circuit is integrated within a programmable logic device.

17. The programmable logic device of claim 16, further comprising a configuration memory, the shift register being operable to write its contents into the configuration memory.

18. The programmable logic device of claim 17, wherein the configuration memory is a volatile memory.

* * * * *